United States Patent [19]

Lacher

[11] 4,150,331

[45] Apr. 17, 1979

[54] SIGNATURE ENCODING FOR INTEGRATED CIRCUITS

[75] Inventor: William A. Lacher, Lansdale, Pa.

[73] Assignee: Burroughs Corporation, Detroit, Mich.

[21] Appl. No.: 820,233

[22] Filed: Jul. 29, 1977

[51] Int. Cl.² .............................................. G01R 15/12
[52] U.S. Cl. .................................... 324/73 PC; 324/51
[58] Field of Search ............ 324/73 PC, 73 R, 158 R, 324/158 D, 51

[56] References Cited

U.S. PATENT DOCUMENTS

| 3,609,546 | 9/1971 | Magnusson et al. | 324/158 D |
| 3,777,129 | 12/1973 | Mehia | 324/73 PC X |
| 3,803,483 | 4/1974 | McMahon, Jr. | 324/51 |

FOREIGN PATENT DOCUMENTS 974589 9/1975 Canada .................................. 324/73 PC Primary Examiner—Stanley T. Krawczewicz
Attorney, Agent, or Firm—Francis A. Varallo; Edmund M. Chung; Kevin R. Peterson

[57] ABSTRACT

The present disclosure describes an improved integrated circuit chip which includes in addition to the logic circuits for performing its design function, an additional circuit for providing a unique reference pattern in digital form useful for test purposes. This reference pattern is automatically read by the tester and gives information as to the type of chip and its final signature. The former indicates to the tester an appropriate test routine such as a pseudo-random binary sequence; and the latter, the predetermined digital pattern which will be present on all of the input and output terminals of a properly functioning integrated circuit chip at the conclusion of the test. Since each chip signature is read by the tester itself, no reference to signatures customarily recorded in tables or inscribed on circuit schematics is required by the test technician.

12 Claims, 2 Drawing Figures

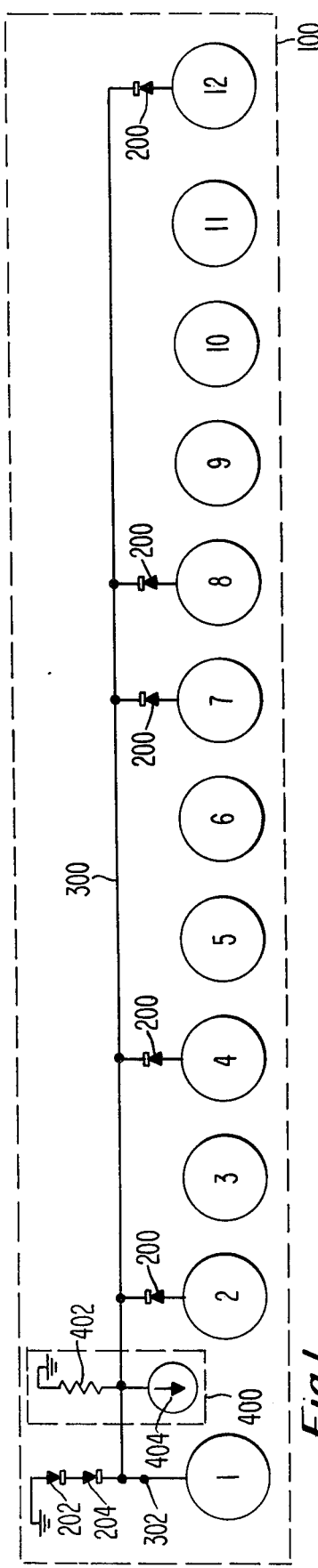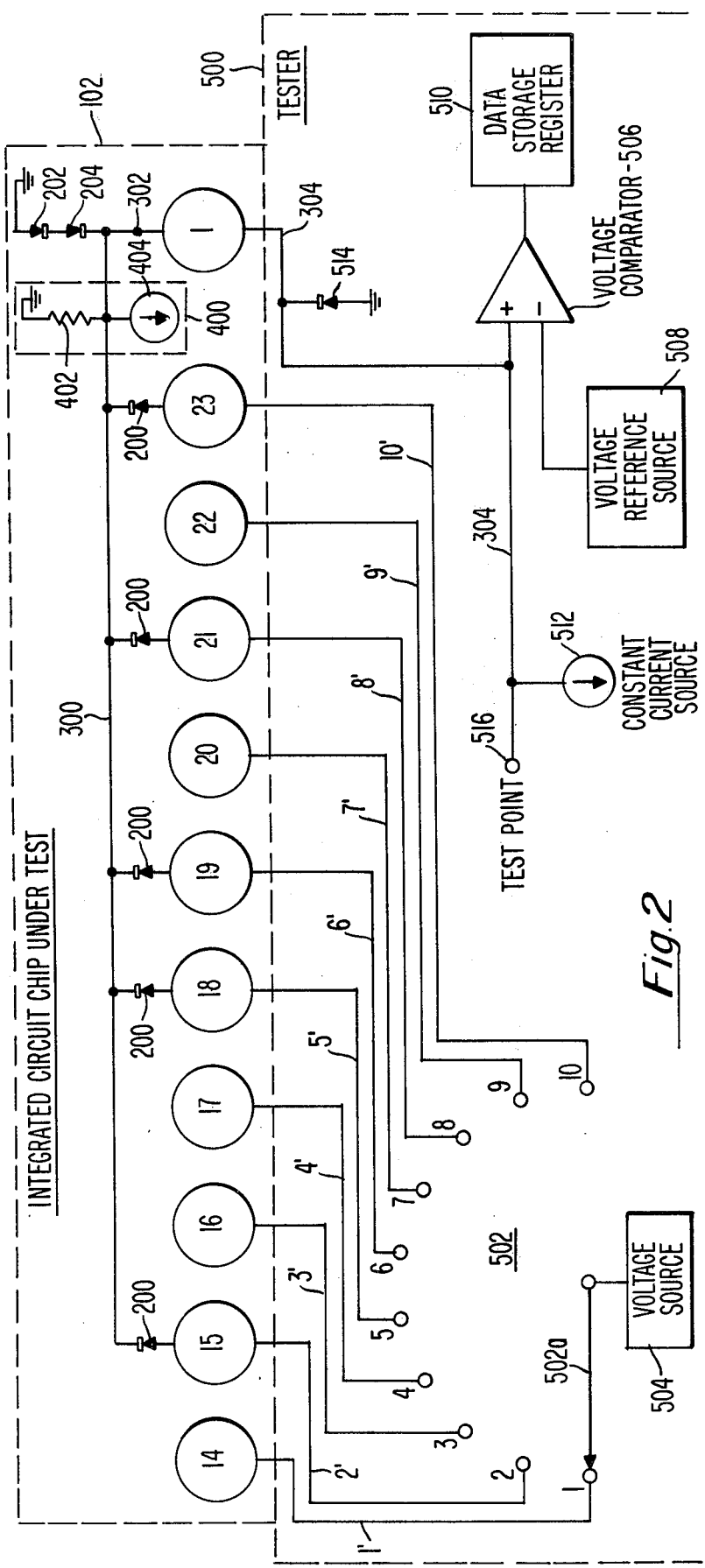
Fig.1
Fig.2

SIGNATURE ENCODING FOR INTEGRATED CIRCUITS

CROSS REFERENCE TO RELATED APPLICATIONS

The encoding of a signature within an integrated circuit package in the manner taught by the present invention finds particular application in the testing of high density integrated circuits disposed on island assemblies as described and claimed in application Ser. No. 513,282, which issued as U.S. Pat. No. 3,946,276, for "Island Assembly Employing Cooling Means for High Density Integrated Circuit Packaging" by Robert E. Braun et al. Also pertinent is application Ser. No. 513,278 for "Integrated Circuit Package Connector with Probing Facility", by Robert E. Braun et al., now U.S. Pat. No. 3,955,867 which describes and claims a unique connector for facilitating electrical probing for test purposes. Through the use of the probing fixture described in the application, a tester may access the digital signature encoded within the integrated circuit chip. Both applications are assigned to the same assignee as the present application.

BACKGROUND OF THE INVENTION

The referenced applications describe the high density packaging of integrated circuits which is common in modern electronic equipment, particularly data processors. The need exists for convenient and reliable methods for testing integrated circuit chips both separately and mounted in-place in a working configuration.

In connection with the testing of integrated circuit chips, it is known that depending upon the logic function of a given chip, a digital reference pattern or signature exists on all of its input and output pins at the end of a test routine. More specifically, in the case of a chip bearing sequential logic in the form of gates, a pseudo-random test sequence may be employed to exercise the logic function. At the conclusion of a predetermined number of interactive iterations of the test sequence, a unique signature for the chip will be present. Assuming that the chip is satisfactory, all similar chips will have the identical signature. In practice, a computer may be programmed to simulate the pseudo-random test and to define the proper signature for the chip as a function of its logic. Deviation of the signature present after an actual test sequence with that defined by the computer analysis, is indicative of a defective chip.

It is present-day practice to make the known signature available to the test technician through the use of tables, annotated schematics, etc. Various visual forms of documenting signatures are depicted in FIGS. 4, 5, 6 and 8 of a technical article entitled "Signature Analysis—Concepts, Examples, and Guidelines" by Hans J. Nadig, appearing in the May 1977 issue of the "Hewlett-Packard Journal". In another related publication of the Hewlett-Packard Company, dated April 1977, and entitled "Application Note 222, A Designer's Guide to Signature Analysis", Section VI, "Documentation", mentions "annunciating schematics", "signature tables", "signature maps" and "troubleshooting trees" or "flow diagrams" for documenting signatures in a service manual. The updating of such documentation is difficult to implement and is costly. Furthermore, the loss of such documentation may render the tester useless.

The ideal solution to the signature documentation problem is the inclusion of the final signature within the chip itself during its manufacture, such that it can be read by the tester without human intervention. The present invention offers such a solution.

SUMMARY OF THE INVENTION

The present disclosure provides circuit means included within each integrated circuit chip of a digital circuit family at the time of its manufacture. The circuit has a configuration determined by the type of chip and its known signature in digital form capable of being read by the test device prior to initiation of a test sequence.

In implementing the invention in an actual integrated circuit package of the type described in the referenced applications, a plurality of input and output pins are available to encode a reference digital pattern and a single pin is reserved for Test and Diagnostic (T & D) purposes. A plurality of diodes, or other unidirectional current conducting devices, are connected between selected ones of the aforementioned input/output pins and a common bus connected to the T&D pin. Where a logic "0" is desired in the chip signature, a diode is installed; if a "1" is desired, the diode is omitted. Prior to the actual test of the chip to determine its acceptability, the tester applies a current sink to the T&D pin and sequentially impresses a predetermined potential on each of the input/output pins. Through the use of the common bus, the logic levels appearing sequentially on the T&D pin correspond respectively to the circuit configurations at the signature pins. These logic levels are interpreted as either a "1" or a "0", and as a composite define the chip signature in binary form.

As implied previously, the chip type may also be read by the tester. In this case, a few of the input or output pins, for example, 3 pins, may be reserved for this function. These "type" pins may be configured in a circuit arrangement similar to that of the signature pins, such that sequential interrogation thereof, would result in a three bit binary expression at the T&D pin. The tester may utilize this information to perform an appropriate test sequence upon the chip.

It is significant to note that the circuit addition to the integrated circuit chips requires no additional power from those sources which normally supply the chip, and there are no adverse effects on the normal circuit and test and diagnostic functions included in the chip design.

Other features and advantages of the present invention will become apparent in the detailed description appearing hereinafter.

BRIEF DESCRIPTION OF THE DRAWING

FIG. 1 is a highly simplified representation of the pins associated with an integrated circuit chip and a diode circuit configuration within the chip for encoding a predetermined reference data pattern.

FIG. 2 illustrates in simplified form an integrated circuit chip encoded in the general manner of FIG. 1 and depicting by way of example rudimentary means for interrogating and interpreting the digital pattern represented by the particular diode circuit configuration illustrated.

DESCRIPTION OF THE PREFERRED EMBODIMENT

FIG. 1 depicts in schematic form an integrated circuit chip 100 having a plurality of pins represented by circles and bearing the numbers 1 through 12 inclusive associated therewith. Pin 1 is assumed to be reserved for test and diagnostic (T&D) purposes. The other input-/output pins 2-12 serve the logic function for which the chip was designed. A plurality of diodes 200 are also formed into the chip. These diodes are arranged in a predetermined configuration with the anode of each being connected to a selected pin, and all of the diode cathodes being connected to a common bus 300, which in turn is connected to pin 1, the T&D pin.

As will become more apparent from the description of FIG. 2, the presence of a diode 200 connected to a given pin will be interpreted as a logical "0" appearing at that pin. The absence of a diode will signify a logical "1". Several of the pins, for example, pins 2, 3 and 4 in FIG. 1, may be used to generate a code representative of the chip type. In the latter figure, the diodes 200 provide the code "010" which may be read by a test device and interpreted thereby as a chip with a particular logic function. The final chip signature may utilize the remaining pins, such as 5 to 12 inclusive. When interrogated, these pins provide a digital pattern, "11001110". Thus, at the conclusion of a predetermined test sequence performed on the chip 100, it is expected that the voltage levels remaining respectively on pins 5 to 12 at that time, which levels are equivalent to the binary "1"s and "0"s, will be identical to the signature encoded within the chip by diodes 200. If there is a difference in the two patterns, the chip is adjudged to be defective.

A pair of series diodes 202 and 204 within the chip are shown connected to bus 300. The anode of diode 202 is connected to ground potential and its cathode is connected to the anode of diode 204. The latter diode has its cathode connected to bus 300. These diodes offer a protective function by providing a direct path to ground for any excessive current created by pin 1 being shorted to the system negative supply. In the absence of the protective diodes 202 and 204, the excessive current would damage the resistive element 402, which is part of the test and diagnostic circuits 400. Also, by way of paths through the reference pattern diodes 200, the current would harm the other chips connected to the input terminals of chip 100. In connection with the latter, the chip may be constructed such that the metalization at point 302 will open with a predetermined excess amount of current flow through diodes 202 and 204, thereby preventing current feed through via the pattern diodes 200.

FIG. 2 is intended to provide insight into the test environment of the signature encoded chip of the present invention. Thus, FIG. 2 comprises both the chip 102 under test and a tester 500. The latter is a rudimentary combination of devices, which although operatively suited for purposes of the present description, is not to be considered limitative of the invention. For example, the interrogation function is performed by a rotary switch 502. In practice, an electronic shift register might better serve this purpose.

Considering the chip portion of FIG. 2, it will be noted that as described in connection with FIG. 1, a plurality of signature diodes 200 are connected to selected ones of pins 14 through 23 associated with an integrated circuit chip 102. The digital signature encoded within the chip of FIG. 2, from left to right, is "1011001010". Pin 1 is the T&D pin. The cathodes of the signature diodes 200 are connected to a common bus 300 which connects with pin 1. A pair of series protective diodes 202 and 204 as described in FIG. 1 are connected to bus 300. As part of the T&D function, and assuming normal operation, pin 1 is maintained at a predetermined voltage level by circuits 400 connected thereto. Resistor 402 and constant current source 404 which are series configured and have their midpoint connected to bus 300, are assumed to be equivalent to these circuits for purposes of maintaining the aforementioned voltage level on pin 1.

The tester portion 500 of FIG. 2 comprises a rotary switch 502, in which the switch contacts numbered 1 through 10 are connected respectively via conductors 1'-10' inclusive to pins 14 through 23. The moveable switch arm 502a is connected to a voltage source 504.

A voltage comparator 506 having a pair of input terminals and an output terminal is provided. The negative terminal of the comparator is connected to a source of reference voltage 508; the positive, to pin 1 via line 304. The output terminal of comparator 506 is coupled to a data storage register 510. Also connected to line 304 are a constant current source 512, a low level diode clamp 514, and a test point terminal 516. The diode clamp 514 has its cathode connected to line 304 and its anode, to ground potential.

The chip 102 may be tested individually or it may be part of the island assembly described in the referenced U.S. Pat. No. 3,946,276. In either event, if the chip is of the leadless variety, it may be mounted in the connector of the referenced U.S. Pat. No. 3,955,867, and the tester may utilize the probing fixture described therein for accessing the chip terminals.

In the following description of the interrogation of chip 102 to secure its encoded signature, the current and voltage levels mentioned are included solely for purposes of example and are not to be construed as limitative of the invention.

Initially, the tester 500 applies a current sink of approximately 25 milliamperes to pin 1 from the current source 512. At the same time, it will be assumed that arm 502a of rotary switch 502 is touching contact number 1 which is connected to pin 14 via line 1', applying +0.4 volts to the latter pin from voltage source 504. The normal voltage level on pin 1 is −0.4 volts as a result of the voltage drop across resistor 402, nominally 40 ohms, caused by current flow therethrough from constant current source 404 which supplies 10 milliamperes. The application of the 25 milliampere current sink by the tester causes increased current flow through resistor 402. No other path for current is available since there is no signature diode connected between pin 14 and bus 300. The level on pin 1 and line 304 therefore tends to go more negative than −1 volt but is prevented from doing so by diode 514 within the tester, which clamps at approximately −0.8 volts. The clamp diode 514 limits power dissipation in resistor 402, and standardizes the voltage level corresponding to logical "1".

The −0.8 volt level appears on the positive input terminal of the comparator 506, resulting in a "high" level on its output terminal, which is then stored in data register 510 as a logical "1".

The arm 502a of switch 502 is then moved to contact, number 2, where the +0.4 volt is then applied via line 2' to pin 15. Pin 15 is connected by diode 200 to bus 300. In this case, the current flow provided by the constant current source 512 is substantially through diode 200 which is forward biased by the +0.4 volts applied to its anode. The forward voltage drop across this diode is approximately −0.8 volts, and the resultant voltage on pin 1, and line 304 remains about −0.4 volts. This last voltage, which may be read at test point 516 is indicative of a binary "0". When applied to the positive input terminal of comparator 506, it results in a "low" level output therefrom. This "low" level is applied to the data register 510 and is stored therein as a logical "0".

In like manner, each of the other pins 16 through 23 is interrogated in turn until the complete pattern manufactured into the chip has been read out and stored in the data register 510.

Although not depicted in FIG. 2, it may be assumed that after the pattern has been read out and stored, the tester 500 will subject the chip 102 to an appropriate test routine, such as a pseudo-random sequence. At the conclusion of the latter, the tester will compare the final pattern remaining on the pins 14–23 inclusive with the signature previously stored in register 510. If the two binary patterns are identical, the chip is considered good.

From the foregoing description, it is readily apparent that the use of signature encoding in an integrated circuit chip as taught by the present invention results in increased convenience and reliability in the testing of the chip. The latter advantages are achieved with extreme simplicity of design and economy of components. Moreover, the signature addition does not increase the chip power requirements, nor does it interfere with normal circuit or test and diagnostic functions already present within the chip.

Since other modifications varied to fit particular operating requirements will be apparent to those skilled in the art, the invention is not considered limited to the embodiment chosen for purposes of disclosure, and covers all changes and modifications which do not constitute a departure from the true spirit and scope of this invention. Accordingly, all such variations as are in accord with the principles discussed previously are meant to fall within the scope of the following claims.

What is claimed is:

1. In an integrated circuit chip having circuit means for performing a logic function and a plurality of input/output terminals upon which the logic levels associated with said function appear, the improvement comprising:

additional circuit means formed within said chip and being independent of said circuit means for performing said logic function, said additional circuit means being coupled to predetermined ones of said input/output terminals for encoding a fixed unalterable digital reference pattern within said chip.

2. An integrated circuit chip as defined in claim 1 characterized in that said digital reference pattern is comprised of a plurality of signal levels appearing respectively on said input/output terminals in response to the interrogation thereof.

3. An integrated circuit chip as defined in claim 2 further characterized in that said digital reference pattern includes a chip signature, said chip signature being chosen to correspond to the signal levels appearing respectively on a first selected group of said input/output terminals at the conclusion of a predetermined test sequence applied to said chip, said last-mentioned signal levels being indicative of the satisfactory performance by said chip of said logic function.

4. An integrated circuit chip as defined in claim 3 further characterized in that said digital reference pattern includes in addition to said chip signature, data as to the "type" of chip, said data appearing as signal levels on a respective second selected group of said input/output terminals and being useful in the predetermination of said test sequence applied to said chip.

5. In a test system including an integrated circuit chip having circuit means for performing a logic function, said chip comprising:

a plurality of input/output pins associated with said logic function and at least one additional test pin, additional circuit means formed within said chip for encoding a predetermined fixed digital reference pattern therein, said additional circuit means being independent of said circuit means for performing said logic function, said additional circuit means comprising a plurality of unidirectional current conducting devices, each device having at least first and second electrodes, the first electrodes of said devices being connected respectively to selected ones of said input/output pins in accordance with said predetermined reference pattern, the second electrodes of said devices being connected to a common bus, said bus being connected to said test pin, the connection of a unidirectional current conducting device to a given one of said selected pins being indicative of a first binary state associated with said given pin and the absence of said device at another non-selected pin being indicative of a second binary state associated therewith, the respective binary states present on said input/output pins and the signal levels corresponding respectively thereto defining said predetermined fixed digital reference pattern.

6. A system as defined in claim 5 wherein said unidirectional current conducting devices are diodes, the anode of each diode being connected to one of said selected input/output pins and the cathodes of all of said plurality of diodes being connected to said common bus.

7. A system as defined in claim 6 further including within said chip a pair of protective series connected diodes, the anode of a first of said protective diodes being connected to ground potential and its cathode being connected to the anode of a second of said protective diodes, the cathode of said second diode being connected to said common bus.

8. A system as defined in claim 7 wherein said chip further includes test and diagnostic circuits coupled to said test pin.

9. A system as defined in claim 5 further characterized in that a portion of said reference pattern derived from first chosen ones of said input/output pins defines a chip signature selected to correspond to the signal levels present on the respective latter pins of a properly functioning chip at the conclusion of a predetermined test sequence applied to said chip for ascertaining the integrity of the logic function performed thereby.

10. A system as defined in claim 5 further including means for interrogating each input/output pin to ascertain the binary state associated therewith.

11. A system as defined in claim 10 further characterized in that said means for interrogating each input/output pin comprises means for applying a current sink to said test pin and concurrently sequentially applying a voltage potential to each input/output pin, the voltage levels appearing serially on said test pin as a result of said sequential interrogation of said input/output pins being representative of the respective binary states associated with said pins and corresponding to said reference pattern.

12. A system as defined in claim 9 further characterized in that another portion of said reference pattern derived from second chosen ones of said input/output pins defines the "type" of said integrated circuit chip.

* * * * *